United States Patent
He et al.

(10) Patent No.: US 10,008,614 B1
(45) Date of Patent: Jun. 26, 2018

(54) DUAL CHANNEL TRANSISTOR

(71) Applicant: UNITED MICROELECTRONICS CORP., Hsin-Chu (TW)

(72) Inventors: Wanxun He, Singapore (SG); Su Xing, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days. days.

(21) Appl. No.: 15/464,353

(22) Filed: Mar. 21, 2017

(51) Int. Cl.
| | |
|---|---|
| *H01L 29/786* | (2006.01) |
| *H01L 29/417* | (2006.01) |
| *H01L 29/45* | (2006.01) |
| *H01L 29/66* | (2006.01) |

(52) U.S. Cl.
CPC .. *H01L 29/78696* (2013.01); *H01L 29/41733* (2013.01); *H01L 29/456* (2013.01); *H01L 29/66765* (2013.01); *H01L 29/66969* (2013.01); *H01L 29/7869* (2013.01); *H01L 29/78648* (2013.01); *H01L 29/78678* (2013.01)

(58) Field of Classification Search
CPC ......... H01L 29/78696; H01L 29/66765; H01L 29/66969; H01L 29/456; H01L 29/78678; H01L 29/78648; H01L 29/7869; H01L 29/41733
See application file for complete search history.

(56) References Cited

U.S. PATENT DOCUMENTS

| | | | |
|---|---|---|---|
| 8,981,367 B2 | 3/2015 | Yoneda | |
| 8,988,152 B2 | 3/2015 | Ohmaru | |
| 9,006,024 B2 | 4/2015 | Akimoto | |
| 9,761,738 B2 * | 9/2017 | Tokunaga | ......... H01L 29/78696 |
| 2012/0146713 A1 * | 6/2012 | Kim | .................. H01L 29/41733 |
| | | | 327/530 |
| 2015/0179810 A1 | 6/2015 | Yamazaki | |

OTHER PUBLICATIONS

Zhou, Title of Invention: Oxide Semiconductor Device, U.S. Appl. No. 15/230,496, filed Aug. 8, 2016.

* cited by examiner

*Primary Examiner* — David Vu
(74) *Attorney, Agent, or Firm* — Winston Hsu

(57) ABSTRACT

A dual channel transistor includes a first gate electrode, a second gate electrode, a first gate insulation layer, a second gate insulation layer, a silicon semiconductor channel layer, and an oxide semiconductor channel layer. The first gate insulation layer is disposed on the first gate electrode. The silicon semiconductor channel layer is disposed on the first gate insulation layer. The oxide semiconductor channel layer is disposed on the silicon semiconductor channel layer. The second gate insulation layer is disposed on the oxide semiconductor channel layer. The second gate electrode is disposed on the second gate insulation layer.

18 Claims, 4 Drawing Sheets

DUAL CHANNEL TRANSISTOR

BACKGROUND OF THE INVENTION

1. Field of the Invention

The present invention relates to a dual channel transistor, and more particularly, to a dual channel transistor including a silicon semiconductor channel layer and an oxide semiconductor channel layer.

2. Description of the Prior Art

Oxide semiconductor materials, such as indium gallium zinc oxide (IGZO), have been applied in thin film transistors (TFTs) of display devices and field effect transistors (FETs) used in integrated circuits because of properties such as high mobility and low leakage current. However, although the leakage current of the transistor including the oxide semiconductor layer is relatively low, the application field of the present oxide semiconductor transistor is still limited because the threshold voltage (Vt) of the oxide semiconductor transistor is still too high and the on-current ($I_{on}$) of the oxide semiconductor transistor is not high enough for some application such as low power devices. Therefore, it is an important subject for the related industries to improve the electrical performances of the oxide semiconductor transistor without deteriorating the original property of low leakage current.

SUMMARY OF THE INVENTION

It is one of the objectives of the present invention to provide a dual channel transistor. The dual channel transistor includes a silicon semiconductor channel layer and an oxide semiconductor layer. The silicon semiconductor channel layer is used to enhance on-current ($I_{on}$) of the dual channel transistor, and the oxide semiconductor layer contributes to lower leakage current of the dual channel transistor.

A dual channel transistor is provided in an embodiment of the present invention. The dual channel transistor includes a first gate electrode, a second gate electrode, a first gate insulation layer, a second gate insulation layer, a silicon semiconductor channel layer, and an oxide semiconductor channel layer. The first gate insulation layer is disposed on the first gate electrode. The silicon semiconductor channel layer is disposed on the first gate insulation layer. The oxide semiconductor channel layer is disposed on the silicon semiconductor channel layer. The second gate insulation layer is disposed on the oxide semiconductor channel layer. The second gate electrode is disposed on the second gate insulation layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
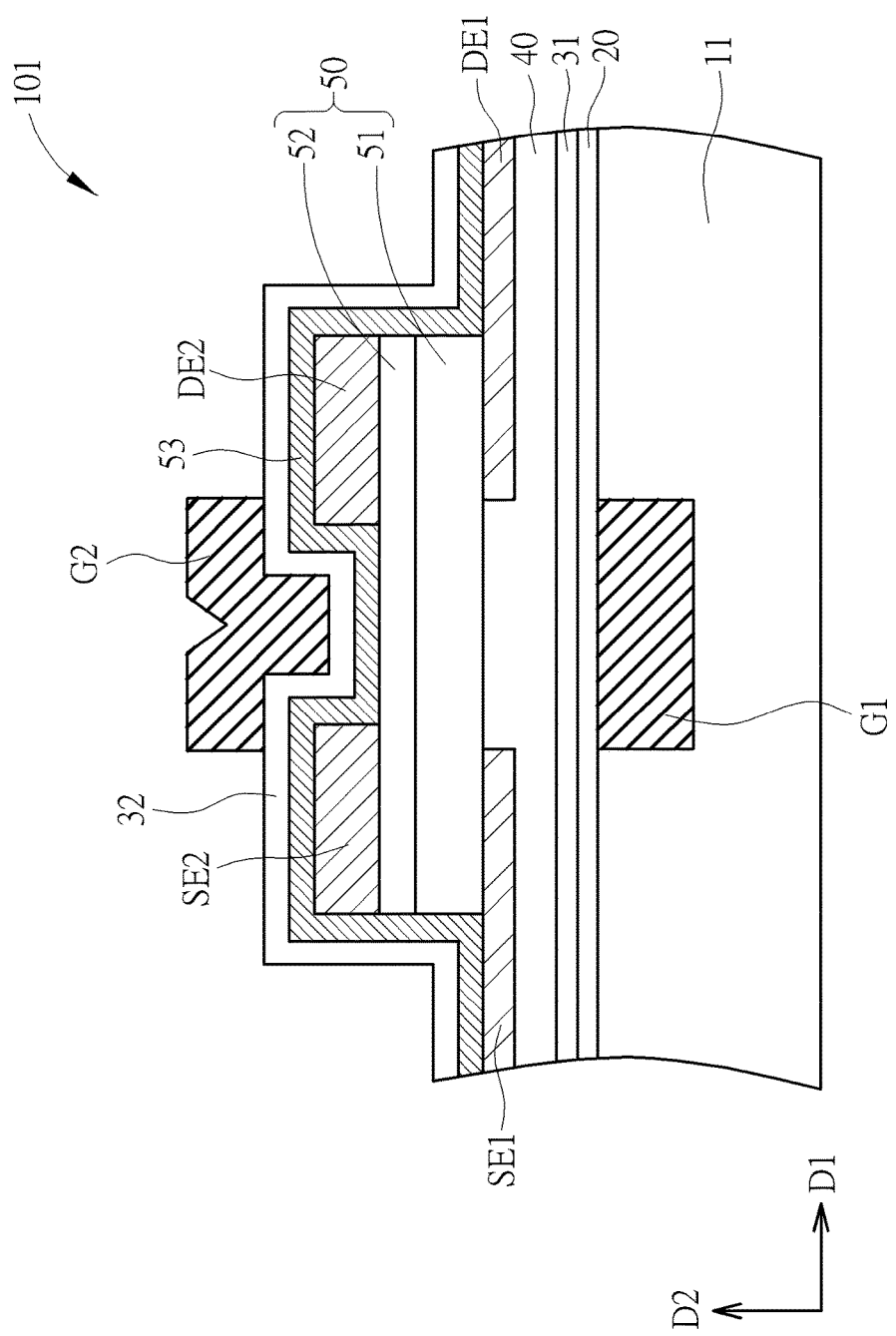
FIG. 1 is a schematic drawing illustrating a dual channel transistor according to a first embodiment of the present invention.
Figure 2:
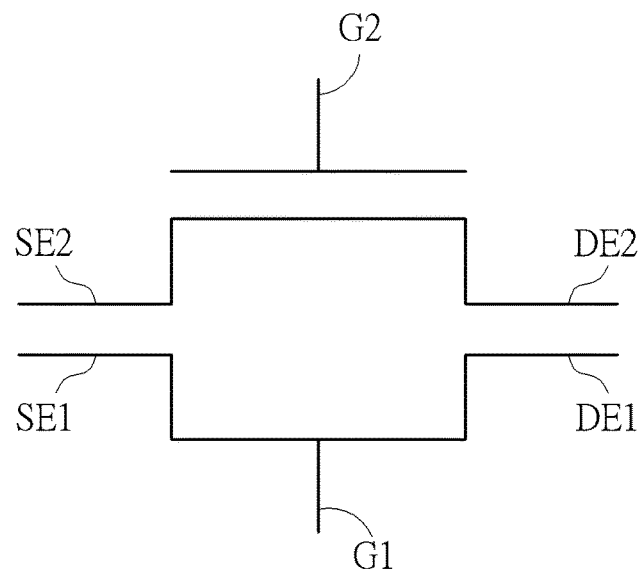
FIG. 2 is a schematic circuit equivalent diagram of the dual channel transistor according to an embodiment of the present invention.
Figure 3:
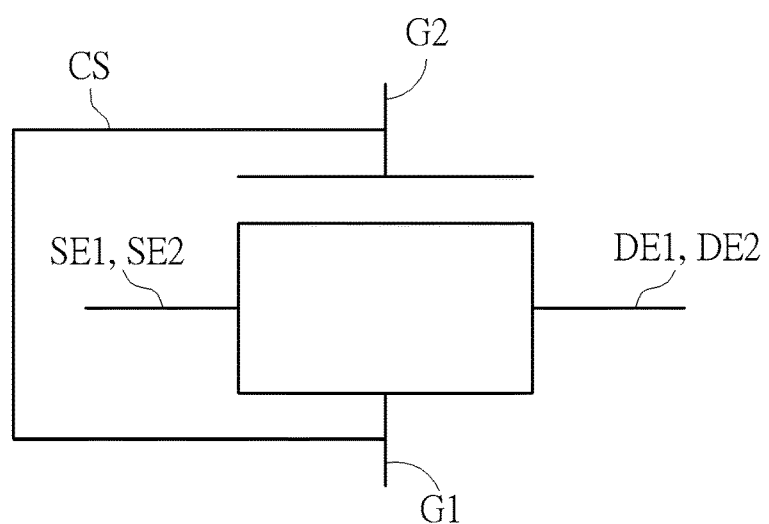
FIG. 3 is a schematic circuit equivalent diagram of the dual channel transistor according to another embodiment of the present invention.

Please refer to FIG. 1, FIG. 2 and FIG. 3. FIG. 1 is a schematic drawing illustrating a dual channel transistor according to a first embodiment of the present invention. FIG. 2 is a schematic circuit equivalent diagram of the dual channel transistor according to an embodiment of the present invention. FIG. 3 is a schematic circuit equivalent diagram of the dual channel transistor according to another embodiment of the present invention. As shown in FIG. 1, a dual channel transistor 101 is provided in this embodiment. The dual channel transistor 101 includes a first gate electrode G1, a second gate electrode G2, a first gate insulation layer 31, a second gate insulation layer 32, a silicon semiconductor channel layer 40, and an oxide semiconductor channel layer 50. The first gate insulation layer 31 is disposed on the first gate electrode G1. The silicon semiconductor channel layer 40 is disposed on the first gate insulation layer 31. The oxide semiconductor channel layer 50 is disposed on the silicon semiconductor channel layer 40. The second gate insulation layer 32 is disposed on the oxide semiconductor channel layer 40. The second gate electrode G2 is disposed on the second gate insulation layer 32. In some embodiments, the silicon semiconductor channel layer 40 may include silicon semiconductor materials with electron mobility higher than that of the oxide semiconductor channel layer 50. For example, the silicon semiconductor channel layer 40 may include single crystalline silicon, polysilicon, such as low temperature polysilicon, or other suitable silicon semiconductor with higher electron mobility. The oxide semiconductor channel layer 50 may include II-VI compounds (such as zinc oxide, ZnO), II-VI compounds doped with alkaline-earth metals (such as zinc magnesium oxide, ZnMgO), II-VI compounds doped with IIIA compounds (such as indium gallium zinc oxide, IGZO), II-VI compounds doped with VA compounds (such as stannum stibium oxide, $SnSbO_2$), II-VI compounds doped with VIA compounds (such as zinc selenium oxide, ZnSeO), II-VI compounds doped with transition metals (such as zinc zirconium oxide, ZnZrO), or other oxide semiconductor materials composed of mixtures of the above-mentioned materials, but not limited thereto. In the dual channel transistor 101, on-current ($I_{on}$) may be enhanced by the silicon semiconductor channel layer 40 with body bias applied to the second gate electrode G2, and leakage current ($I_{off}$) may be lowered because of the material properties of the oxide semiconductor channel layer 50 and may be controlled by body bias applied to the first gate electrode G1. Accordingly, the on-current of the dual channel transistor 101 may be enhanced by the silicon semiconductor channel layer 40 without deteriorating the low leakage current property provided by the oxide semiconductor channel layer 50.

In some embodiments, the first gate electrode G1 and the second gate electrode G2 may be stacked in a vertical direction D2, and the silicon semiconductor channel layer 40 and the oxide semiconductor channel layer are disposed between the first gate electrode G1 and the second gate electrode G2 in the vertical direction D2. The dual channel transistor 101 may be regarded as a dual gate structure, the first gate electrode G1 may be regarded as a bottom gate, and the second gate electrode G2 may be regarded as a top gate, but the present invention is not limited to this. In some embodiments of the present invention, the dual channel transistor may also include more than two gate electrodes. In some embodiments, the materials of the first gate electrode G1 and the second gate electrode G2 may include aluminum (Al), copper (Cu), tungsten (W), molybdenum (Mo), titanium (Ti), tantalum (Ta), or other appropriate conductive materials. The first gate insulation layer 31 and the second gate insulation layer 32 may respectively include an oxide layer such as a silicon oxide layer or other suitable dielectric materials. Additionally, the silicon semiconductor channel layer 40 may directly contact the oxide semiconductor channel layer 50, but the present invention is not limited to this. In some embodiments, other semiconductor layer may also be disposed between the silicon semiconductor channel layer 40 and the oxide semiconductor channel layer 50.

As shown in FIG. 1, the dual channel transistor 101 may further include a first source electrode SE1 and a first drain electrode DE1 disposed on the silicon semiconductor channel layer 40. The first source electrode SE1 and the first drain electrode DE1 may be disposed on the silicon semiconductor channel layer 40 at two opposite sides of the first gate electrode G1 in a horizontal direction D1, but not limited thereto. In some embodiments, the first source electrode SE1 and the first drain electrode DE1 may include silicide regions formed in the silicon semiconductor channel layer 40, but not limited thereto. Other appropriate conductive materials may also be used to form the first source electrode SE1 and the first drain electrode DE1. Additionally, in some embodiments, at least a part of the first source electrode SE1 and a least a part of the first drain electrode DE1 may be disposed between the silicon semiconductor channel layer 40 and the oxide semiconductor channel layer 50 in the vertical direction D2, but not limited thereto. In some embodiments, the dual channel transistor 101 may further include a second source electrode SE2 and a second drain electrode DE2 disposed on the oxide semiconductor channel layer 50. The second source electrode SE2 and the second drain electrode DE2 may be disposed on the oxide semiconductor channel layer 50 at two opposite sides of the second gate electrode G2 in the horizontal direction D1, but not limited thereto. The second source electrode SE2 and the second drain electrode DE2 may include aluminum, copper, tungsten, molybdenum, titanium, tantalum, or other appropriate conductive materials. Apart of the second gate insulation layer 32 is disposed between the second gate electrode G2 and the second source electrode SE1, and a part of the second gate insulation layer 32 is disposed between the second gate electrode G2 and the second drain electrode DE2.

As shown in FIG. 1 and FIG. 2, in some embodiments, the first source electrode SE1 and the first drain electrode DE1 may be electrically isolated from the second source electrode SE2 and the second drain electrode DE2, and the first gate electrode G1 may be electrically isolated from the second gate electrode G2. In other words, different signals may be applied to the first gate electrode G1 and the second gate electrode G2 respectively, and different signals may be applied to and/or received respectively from the first source electrode SE1, the first drain electrode DE1, the second source electrode SE2, and the second drain electrode DE2. As shown in FIG. 1 and FIG. 3, in some embodiments, the first source electrode SE1 may be electrically connected with the second source electrode SE2, the first drain electrode DE1 may be electrically connected with the second drain electrode DE2, and the first gate electrode G1 may be electrically connected with the second gate electrode G2. In some embodiments, the first gate electrode G1 may be electrically connected with the second gate electrode G2 by a connection structure CS, but not limited thereto. The first source electrode SE1 may directly contact the second source electrode SE2, and the first drain electrode DE1 may directly contact the second drain electrode DE2, but not limited thereto. In other words, the electric potential of the first gate electrode G1 may be substantially equal to the electric potential of the second gate electrode G2 in some embodiments of the present invention.

As shown in FIG. 1, in some embodiments, the oxide semiconductor channel layer 50 may include a first oxide semiconductor layer 51 and a second oxide semiconductor layer 52. The first oxide semiconductor layer 51 is disposed between the second oxide semiconductor layer 52 and the silicon semiconductor channel layer 40. A component of the first oxide semiconductor layer 51 may be different from a component of the second oxide semiconductor layer 52 for some design considerations. For example, an electron mobility of the first oxide semiconductor layer 51 may be higher than an electron mobility of the second oxide semiconductor layer 52 for enhancing the on-current of the dual channel transistor 101, but not limited thereto. In some embodiments, the first oxide semiconductor layer 51 may be used as a barrier layer for blocking substance such as silicon from entering the second oxide semiconductor layer 52. Therefore, the concentration of impurities in the second oxide semiconductor channel layer 52 or in the vicinity of the interface between the first oxide semiconductor channel layer 51 and the second oxide semiconductor channel layer 52 may be reduced by the first oxide semiconductor channel layer 51. Additionally, the dual channel transistor 101 may further include a third oxide semiconductor layer 53 disposed between the second gate insulation layer 32 and the second oxide semiconductor layer 52. The third oxide semiconductor layer may include II-VI compounds, II-VI compounds doped with alkaline-earth metals, II-VI compounds doped with IIIA compounds, II-VI compounds doped with VA compounds, II-VI compounds doped with VIA compounds, II-VI compounds doped with transition metals, or other oxide semiconductor materials composed of mixtures of the above-mentioned materials, but not limited thereto. In some embodiments, a component of the third oxide semiconductor layer 53 may be different from the component of the second oxide semiconductor layer 52, but not limited thereto. For example, an electron mobility of the third oxide semiconductor layer 53 may be higher than the electron mobility of the second oxide semiconductor layer 52. In addition, the third oxide semiconductor layer 53 may also be used as a barrier layer for blocking substance such as silicon from entering the second oxide semiconductor layer 52. Therefore, the third oxide semiconductor layer 53 may be further disposed on the first source electrode SE1, the first drain electrode DE1, the second source electrode SE2, and the second drain electrode DE2, and the third oxide semiconductor layer 53 may further cover a side surface of the second oxide semiconductor layer 52 and a side surface of the first oxide semiconductor layer 51 in the horizontal direction D1. The second gate insulation layer 32 may be conformally disposed on the third oxide semiconductor layer 53, but not limited thereto. Additionally, the dual channel transistor 101 may further include a work function layer 20 disposed between the first gate electrode G1 and the first gate insulation layer 31. The work function layer 20 may include titanium nitride (TiN), tantalum nitride (TaN), titanium carbide (TiC), tantalum carbide (TaC), tungsten carbide (WC), aluminum titanium nitride (TiAlN), titanium aluminide (TiAl), zirconium aluminide (ZrAl), tungsten aluminide (WAl), tantalum aluminide (TaAl), hafnium aluminide (HfAl), or other suitable work function materials.

Figure 4:
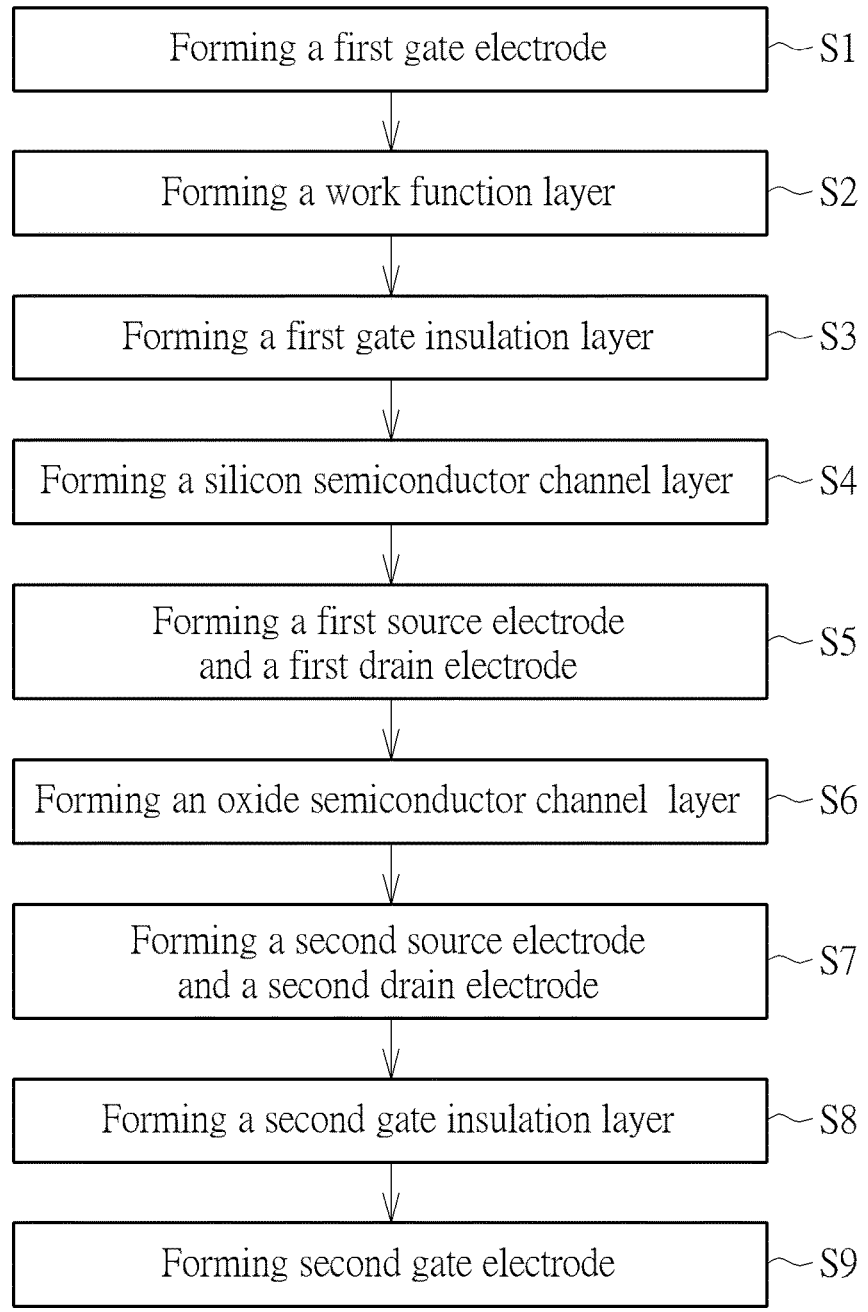
FIG. 4 is a flow chart of a manufacturing method of the dual channel transistor according to the first embodiment of the present invention.

Please refer to FIG. 1 and FIG. 4. FIG. 4 is a flow chart of a manufacturing method of the dual channel transistor 101 in this embodiment. The manufacturing method of the dual channel transistor 101 may include but is not limited to the following steps. As shown in FIG. 1 and FIG. 4, in step S1, the first gate electrode G1 is formed in a dielectric layer 11, and the dielectric layer 11 may be formed on a substrate (not shown). The substrate may include a semiconductor substrate, a glass substrate, a plastic substrate, a ceramic substrate, or substrates made of other suitable materials. The semiconductor substrate mentioned above may include a silicon substrate, an epitaxial silicon substrate, a silicon germanium substrate, a silicon carbide substrate, or a silicon-on-insulator (SOI) substrate, but not limited thereto. For example, in some embodiments, the substrate may be a semiconductor substrate, and at least one silicon-based field effect transistor (not shown) may be formed on the substrate before the step of forming the dielectric layer 11. Specifically, a plurality of the silicon-based field effect transistors and interconnection structures (not shown) may be formed on the substrate, and the first gate electrode G1 may be formed by a process of forming a part of the interconnection structure, so as to simplify the manufacturing processes, but not limited thereto.

In step S2, the work function layer 20 is formed on the dielectric layer 11 and the first gate electrode G1. In step S3, the first gate insulation layer 31 is formed on the work function layer. In step S4, the silicon semiconductor channel layer 40 is formed on the first gate insulation layer 31. In some embodiments, the silicon semiconductor channel layer 40 may be a low temperature polysilicon for reducing influences on the first gate insulation layer 31 during the manufacturing step of the silicon semiconductor channel layer 40, but not limited thereto. In step S5, the first source electrode SE1 and the first drain electrode DE1 are formed in the silicon semiconductor channel layer 40. In step S6, the oxide semiconductor channel layer 50 is formed on the silicon semiconductor channel layer 40, the first source electrode SE1, and the first drain electrode DE1. In step S7, the second source electrode SE2 and the second drain electrode DE2 are formed on the oxide semiconductor channel layer 50. In step S8, the second gate insulation layer 32 is formed on the oxide semiconductor channel layer 50, the second source electrode SE2, and the second drain electrode DE2. In some embodiments, before the step of forming the second gate insulation layer 32, the third oxide semiconductor layer 53 may be formed on the oxide semiconductor channel layer 50, the second source electrode SE2, the second drain electrode DE2, the first source electrode SE1, the first drain electrode DE1, and a side surface of the oxide semiconductor channel layer 50. The first oxide semiconductor layer 51, the second oxide semiconductor layer 52, and the third oxide semiconductor layer 53 may be respectively formed by a physical vapor deposition (PVD) process, a chemical vapor deposition process, or other suitable processes. In step S9, the second gate electrode G2 is formed on the second gate insulation layer 32. It is worth noting that the manufacturing method of the dual channel transistor 101 is not limited to the approaches mentioned above, and other appropriate processes and/or different process sequences may also be used to form the dual channel transistor 101.

Figure 5:
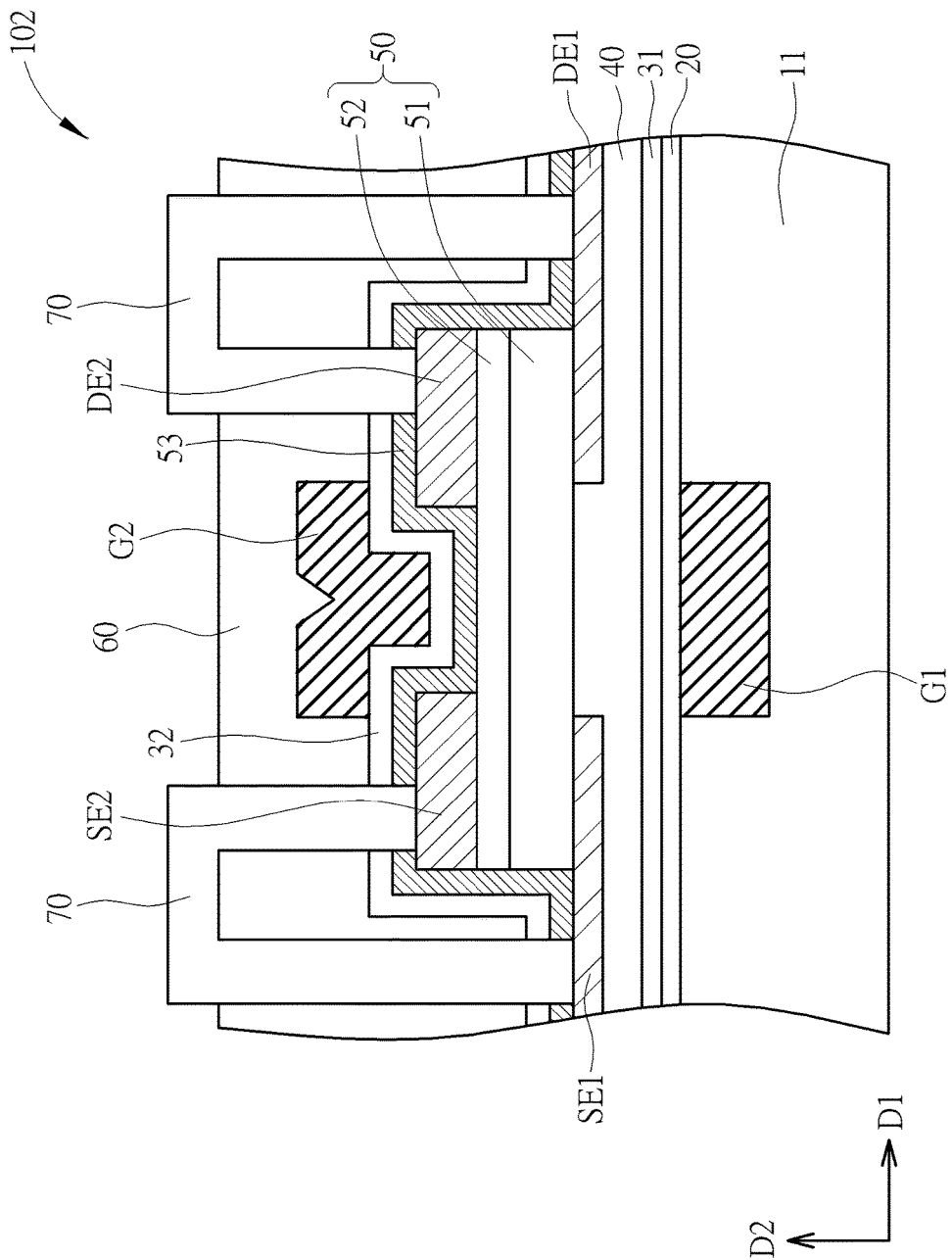
FIG. 5 is a schematic drawing illustrating a dual channel transistor according to a second embodiment of the present invention.

Please refer to FIG. 5. FIG. 5 is a schematic drawing illustrating a dual channel transistor 102 according to a second embodiment of the present invention. As shown in FIG. 5, the dual channel transistor 102 further includes an insulation layer 60 and a plurality of contact structures 70. The insulation layer 60 covers the second gate electrode G2 and the second gate insulation layer 32, and each of the contact structures 70 penetrates the insulation layer 60, the second gate insulation layer 32, and the third oxide semiconductor layer 53 for contacting the first source electrode SE1 and the second source electrode SE2 or contacting the first drain electrode DE1 and the second drain electrode DE2. The first source electrode SE1 may be electrically connected with the second source electrode SE2 via one of the contact structures 70, and the first drain electrode DE1 may be electrically connected with the second drain electrode DE2 via another one of the contact structure 70.

To summarize the above descriptions, in the dual channel transistor of the present invention, the on-current of the dual channel transistor may be enhanced by the silicon semiconductor channel layer, and the leakage current of the dual channel transistor may be lowered because of the material properties of the oxide semiconductor channel layer. Accordingly, the on-current of the dual channel transistor may be enhanced by the silicon semiconductor channel layer without deteriorating the low leakage current property provided by the oxide semiconductor channel layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dual channel transistor, comprising:
   a first gate electrode;
   a first gate insulation layer disposed on the first gate electrode;
   a silicon semiconductor channel layer disposed on the first gate insulation layer;
   an oxide semiconductor channel layer disposed on the silicon semiconductor channel layer;
   a second gate insulation layer disposed on the oxide semiconductor channel layer;
   a second gate electrode disposed on the second gate insulation layer;
   a first source electrode and a first drain electrode disposed on the silicon semiconductor channel layer; and
   a second source electrode and a second drain electrode disposed on the oxide semiconductor channel layer.

2. The dual channel transistor of claim 1, wherein the silicon semiconductor channel layer directly contacts the oxide semiconductor channel layer.

3. The dual channel transistor of claim 1, wherein the silicon semiconductor channel layer comprises polysilicon.

4. The dual channel transistor of claim 1, wherein at least a part of the first source electrode and a least a part of the first drain electrode are disposed between the silicon semiconductor channel layer and the oxide semiconductor channel layer.

5. The dual channel transistor of claim 1, wherein the first source electrode and the first drain electrode comprise silicide regions formed in the silicon semiconductor channel layer.

6. The dual channel transistor of claim 1, wherein the first source electrode and the first drain electrode are electrically isolated from the second source electrode and the second drain electrode.

7. The dual channel transistor of claim 1, wherein the first source electrode is electrically connected with the second source electrode, and the first drain electrode is electrically connected with the second drain electrode.

8. The dual channel transistor of claim 1, wherein the oxide semiconductor channel layer comprises a first oxide semiconductor layer and a second oxide semiconductor layer, the first oxide semiconductor layer is disposed between the second oxide semiconductor layer and the silicon semiconductor channel layer, and a component of the first oxide semiconductor layer is different from a component of the second oxide semiconductor layer.

9. The dual channel transistor of claim 8, wherein an electron mobility of the first oxide semiconductor layer is higher than an electron mobility of the second oxide semiconductor layer.

10. The dual channel transistor of claim 8, further comprising:
a third oxide semiconductor layer disposed between the second gate insulation layer and the second oxide semiconductor layer, wherein a component of the third oxide semiconductor layer is different from the component of the second oxide semiconductor layer.

11. The dual channel transistor of claim 10, wherein an electron mobility of the third oxide semiconductor layer is higher than an electron mobility of the second oxide semiconductor layer.

12. The dual channel transistor of claim 10, wherein the third oxide semiconductor layer is further disposed on the first source electrode and the first drain electrode.

13. The dual channel transistor of claim 10, wherein the third oxide semiconductor layer is further disposed on the second source electrode and the second drain electrode.

14. The dual channel transistor of claim 10, wherein the third oxide semiconductor layer further covers a side surface of the second oxide semiconductor layer.

15. The dual channel transistor of claim 10, wherein the third oxide semiconductor layer further covers a side surface of the first oxide semiconductor layer.

16. The dual channel transistor of claim 1, further comprising:
a work function layer disposed between the first gate electrode and the first gate insulation layer.

17. The dual channel transistor of claim 1, wherein the first gate electrode is electrically isolated from the second gate electrode.

18. The dual channel transistor of claim 1, wherein the first gate electrode is electrically connected with the second gate electrode.

* * * * *